(12) United States Patent
Bhatt et al.

(10) Patent No.: US 6,808,668 B2
(45) Date of Patent: *Oct. 26, 2004

(54) PROCESS FOR FABRICATING COMPOSITE SUBSTRATE CARRIER

(75) Inventors: Sanjiv M. Bhatt, Minnetonka, MN (US); Shawn D. Eggum, Lonsdale, MN (US)

(73) Assignee: Entegris, Inc., Chaska, MN (US)

(*) Notice: Subject to any disclaimer, the term of this patent is extended or adjusted under 35 U.S.C. 154(b) by 3 days.

This patent is subject to a terminal disclaimer.

(21) Appl. No.: 10/212,459

(22) Filed: Aug. 5, 2002

(65) Prior Publication Data

US 2003/0025244 A1 Feb. 6, 2003

Related U.S. Application Data

(63) Continuation-in-part of application No. 09/317,989, filed on May 25, 1999, now Pat. No. 6,428,729.
(60) Provisional application No. 60/087,205, filed on May 28, 1998.

(51) Int. Cl.[7] .................. B29C 45/14; B29C 70/76; B29C 70/88
(52) U.S. Cl. .............. 264/254; 264/255; 264/271.1
(58) Field of Search .................. 264/250, 254, 264/255, 267, 268, 271.1, 272.11, 272.15, 272.17; 206/711, 454; 211/41.12, 41.18; 118/500

(56) References Cited

U.S. PATENT DOCUMENTS

| | | |
|---|---|---|
| 324,671 A | 8/1885 | Drake |
| 4,532,970 A | 8/1985 | Tullis et al. |
| 4,676,709 A | 6/1987 | Bonora et al. |
| 4,739,882 A | 4/1988 | Parikh et al. |
| 4,815,912 A | 3/1989 | Maney et al. |
| 4,995,430 A | 2/1991 | Bonora et al. |
| 5,024,329 A | 6/1991 | Grohrock |
| 5,111,936 A * | 5/1992 | Kos ........................ 211/41.18 |
| 5,445,271 A | 8/1995 | Kakizaki et al. |
| 5,452,795 A | 9/1995 | Gallagher et al. |
| 5,469,963 A | 11/1995 | Bonora et al. |
| 5,482,161 A | 1/1996 | Williams et al. |
| 5,570,987 A | 11/1996 | McKenna |
| 5,584,401 A | 12/1996 | Yoshida |
| D378,873 S | 4/1997 | Gregerson et al. |
| 5,788,082 A * | 8/1998 | Nyseth ........................ 206/711 |
| 5,853,214 A * | 12/1998 | Babbs et al. ................ 294/161 |
| 6,006,919 A | 12/1999 | Betsuyaku |
| 6,082,540 A | 7/2000 | Krampotich et al. |

(List continued on next page.)

FOREIGN PATENT DOCUMENTS

| | | |
|---|---|---|
| EP | 0 744 765 A1 | 11/1996 |
| EP | 5 579 099 B1 | 1/1997 |
| NL | 1006529 | 1/1998 |
| WO | WO 97/13710 | 4/1997 |

*Primary Examiner*—Angela Ortiz
(74) *Attorney, Agent, or Firm*—Patterson, Thuente, Skaar & Christensen, P.A.

(57) ABSTRACT

A process for manufacturing a wafer carrier including injection molding a wafer support structure. The wafer support structure has a plurality of wafer support shelves extending therefrom. The process further includes molding a wafer contact portion on each of the wafer support shelves. The wafer contact portions bond with the wafer support shelves without mechanical fasteners between the wafer contact portions and the wafer support shelves. The process also includes overmolding a shell over the wafer support structure to form the wafer carrier. The shell bonds with the wafer support structure without mechanical fasteners between the shell and the wafer support structure. The wafer contact portions define a plurality of slots for holding a plurality of wafers.

13 Claims, 3 Drawing Sheets

U.S. PATENT DOCUMENTS

| | | | |
|---|---|---|---|
| 6,101,008 A | 8/2000 | Popovich | |
| 6,216,874 B1 * | 4/2001 | Bores et al. | 206/711 |
| 6,267,245 B1 | 7/2001 | Bores et al. | |
| 6,273,261 B1 | 8/2001 | Hosoi | |
| 6,382,419 B1 | 5/2002 | Fujimori et al. | |
| 6,398,032 B2 | 6/2002 | Fosnight et al. | |
| 6,428,729 B1 * | 8/2002 | Bhatt et al. | 264/254 |
| 6,432,849 B1 | 8/2002 | Endo et al. | |
| 6,520,338 B2 * | 2/2003 | Bores et al. | 206/711 |
| 6,644,477 B2 * | 11/2003 | Bores et al. | 206/711 |
| 2002/0020650 A1 | 2/2002 | Fujimori et al. | |
| 2003/0047476 A1 | 3/2003 | Wu et al. | |

* cited by examiner

PROCESS FOR FABRICATING COMPOSITE SUBSTRATE CARRIER

REFERENCE TO RELATED APPLICATIONS

This application is a continuation-in-part of U.S. patent application Ser. No. 09/317,989 filed May 25, 1999, now U.S. Pat. No. 6,428,729, which claims benefit to the filing date of U.S. Provisional Application Ser. No. 60/087,205, filed May 28, 1998. Each of these applications is hereby incorporated by reference.

FIELD OF THE INVENTION

This invention relates to devices for confining memory disk, silicon wafers, and the like for transport, storage, and processing. More particularly, the invention relates to a process for fabricating a composite wafer or disk carrier.

BACKGROUND OF THE INVENTION

Certain carriers are utilized for transporting and storing batches of silicon wafers or magnetic disks before, during, and after processing of the disks or wafers. The wafers are processed into integrated circuits and the disks are processed into magnetic storage disks for computers. "Wafers," when used herein, refers to silicon wafers, magnetic substrates, and the like.

The processing of wafer disks into integrated circuit chips often involves several steps where the disks are repeatedly processed, stored and transported. Due to the delicate nature of the disks and their extreme value, it is vital that they are properly protected throughout this procedure. One purpose of a wafer carrier is to provide this protection. Additionally, since the processing of wafer disks is generally automated, it is necessary for disks to be precisely positioned relative to the processing equipment for the robotic removal and insertion of the wafers. A second purpose of a wafer carrier is to securely hold the wafer disks during transport.

Carriers are generally configured to axially arrange the wafers or disks in slots, and to support the wafers or disks by or near their peripheral edges. The wafers or disks are conventionally removable from the carriers in a radial direction upwardly or laterally. Carriers may have supplemental covers, bottom covers, or enclosures to enclose the wafers or disks.

There are a number of material characteristics that are useful and advantageous for wafer carriers, depending on the type of carrier and the particular part of the carrier at issue.

During processing of semiconductor wafers or magnetic disks, the presence of or generation of particulates presents very significant contamination problems. Contamination is accepted as the single biggest cause of yield loss in the semiconductor industry. As the size of integrated circuitry has continued to be reduced, the size of particles that can contaminate an integrated circuit has also become smaller, making minimization of contaminants all the more critical.

Contaminants in the form of particles may be generated by abrasion such as the rubbing or scraping of the carrier with the wafers or disks, with the carrier covers or enclosures, with storage racks, with other carriers, or with the processing equipment. A most desirable characteristic of a carrier is therefore a resistance to particle generation upon abrasion, rubbing, or scraping of the plastic molded material. U.S. Pat. No. 5,780,127 discusses various characteristics of plastics which are pertinent to the suitability of such materials for wafer carriers. Said patent is incorporated by reference.

Carrier materials should also have minimal outgassing of volatile components as these may leave films that also constitute a contaminant, which can damage wafers and disks.

The carrier materials must have adequate dimensional stability—that is, rigidity—when the carrier is loaded.

Dimensional stability is necessary to prevent damage to the wafers or disks and to minimize movement of the wafers or disks within the carrier. The tolerances of the slots holding wafers and disks are typically quite small and any deformation of the carrier can directly damage the highly brittle wafers or can increase the abrasion and thus the particle generation when the wafers or disks are moved into, out of, or within the carrier.

Dimensional stability is also extremely important when the carrier is loaded in some direction such as when the carriers are stacked during shipment or when the carriers integrate with processing equipment. The carrier material should also maintain its dimensional stability under elevated temperatures, which may be encountered during storage or cleaning.

Conventional carriers used in the semiconductor industry may develop and retain static charges. When a charged plastic part comes into contact with an electronic device or processing equipment it may discharge in a damaging phenomena known as electrostatic discharge (ESD). Additionally, statically charged carriers may attract and retain particles, particularly airborne particles. Also static buildup on carriers can cause semiconductor processing equipment to automatically shut down. It is most desirable to have a carrier with static dissipation characteristics to eliminate ESD and to avoid attracting particles.

Trace metals are a common ingredient or residue in many potential wafer carrier materials. Metal contamination must be considered in material selection and assembly methods of carriers. Anion contamination in carrier materials can cause contamination and corrosion problems.

Material used in carriers must also be chemically compatible to any chemicals that they may be subjected to. Although transport and storage wafer carriers are not intended for chemical use, they must be resistant to cleaning solutions and commonly used solvents such as isopropyl alcohol. Process carriers are subject to ultrapure acids and other harsh chemicals.

Visibility of wafers within closed containers is highly desirable and may be required by end users. Transparent plastics suitable for such containers, such as polycarbonates, are desirable in that such plastic is low in cost but such plastics do not have desirable static dissipative characteristics, nor desirable abrasion resistance.

Other important characteristics include the cost of the carrier material and the ease of molding the material.

Carriers are typically formed of injection molded plastics such as polycarbonate (PC), acrylonitrile butadiene styrene (ABS), polypropylene (PP), polyethylene (PE), perfluoroalkoxy (PFA), and polyetheretherketone (PEEK).

Fillers that have been added to injection molded plastics for static dissipation include carbon powder or fiber, metal fibers, metal coated graphite, and organic (amine-based) additives.

One common conventional wafer carrier used for transport and storage is a single molded part generally comprising a front end having an H-bar interface portion, a back end having a panel, and sidewalls having slots and lower curved or converging portions following the curvature of the wafers, and with an open top and open bottom. H-bar carriers will often be reused several times and then discarded. Between uses, the carriers will typically be washed in hot water and/or other chemicals and they are then dried with hot air. It is a valuable characteristic to have a carrier that holds it shape when subjected to the higher temperatures associated with the cleaning, drying, transporting, and processing the carriers.

Another conventional carrier is a box configured to hold an H-bar carrier. Such boxes are commonly known as work-in-process (WIP) boxes.

Another conventional carrier is a standardized mechanical interface (SMIF) pod that is comprised of a box that sealingly encloses an H-bar carrier, which mechanically interfaces with process equipment. SMIF pods typically have a bottom-opening door for accessing the H-bar carrier with wafers. Boxes are also known that have front-opening doors for accessing the H-bar carrier. Another known carrier is a transport module that is a box enclosure with a front-opening door and internal shelves that support the wafers, rather than a separate H-bar carrier.

It must be recognized that the ideal material for one part of a carrier is typically not the ideal material for a different part of the same carrier. For example, PEEK is a material that has ideal abrasion resistance characteristics ideal for wafer contact portions but is difficult to mold and is, relative to other plastics, very expensive. Thus, PEEK may not be as good of a choice as other plastics, such a polycarbonate, for structural portions.

The only instances that different materials are known to have been used for different portions of disk carriers is by separately molding the different portions, then assembling them into a carrier. Such assembly presents the disadvantage of surface-to-surface contact of different components, which can create particle or contaminant entrapment areas that are difficult to clean. Additionally, the assembly process can generate particles. Moreover, the molding of different component parts and assembling same in a carrier involves labor and thus expense.

SUMMARY OF THE INVENTION

The present invention is direct to a process for manufacturing a wafer carrier. The process includes injection molding a wafer support structure, molding a wafer contact portion on each of the wafer support shelves, and overmolding a shell over the wafer support structure to form the wafer carrier.

The wafer support structure has a plurality of wafer support shelves extending therefrom. The wafer contact portions bond with the wafer support shelves without mechanical fasteners between the wafer contact portions and the wafer support shelves. The shell bonds with the wafer support structure without mechanical fasteners between the shell and the wafer support structure. The wafer contact portions define a plurality of slots for holding a plurality of wafers.

DETAILED DESCRIPTION OF THE PREFERRED EMBODIMENTS

Figure 1:
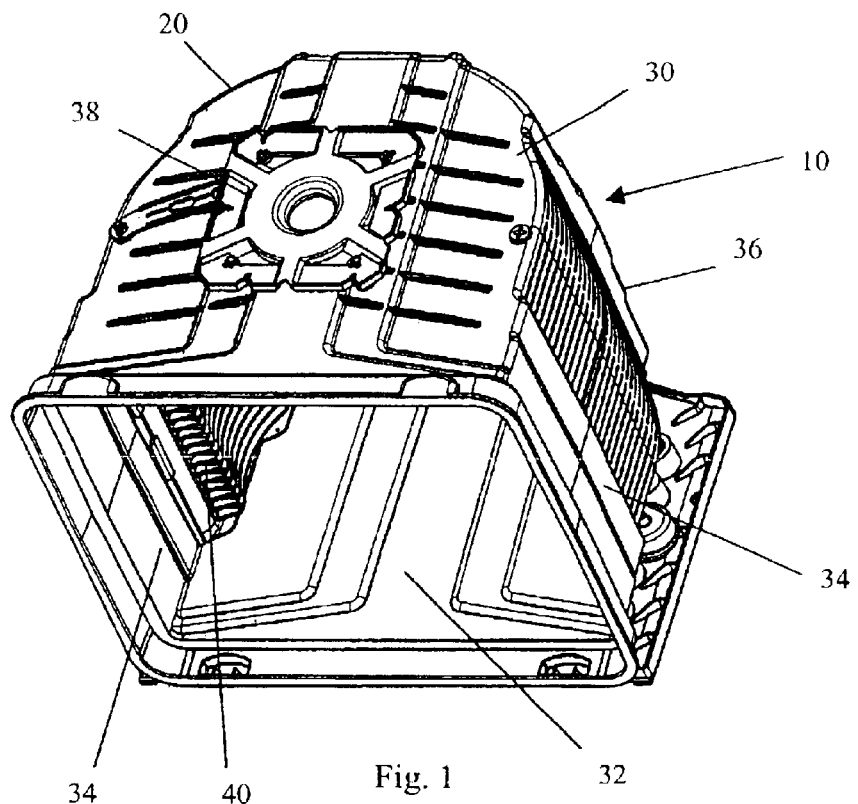
FIG. 1 is a perspective view of a wafer carrier of the present invention.
Figure 2:
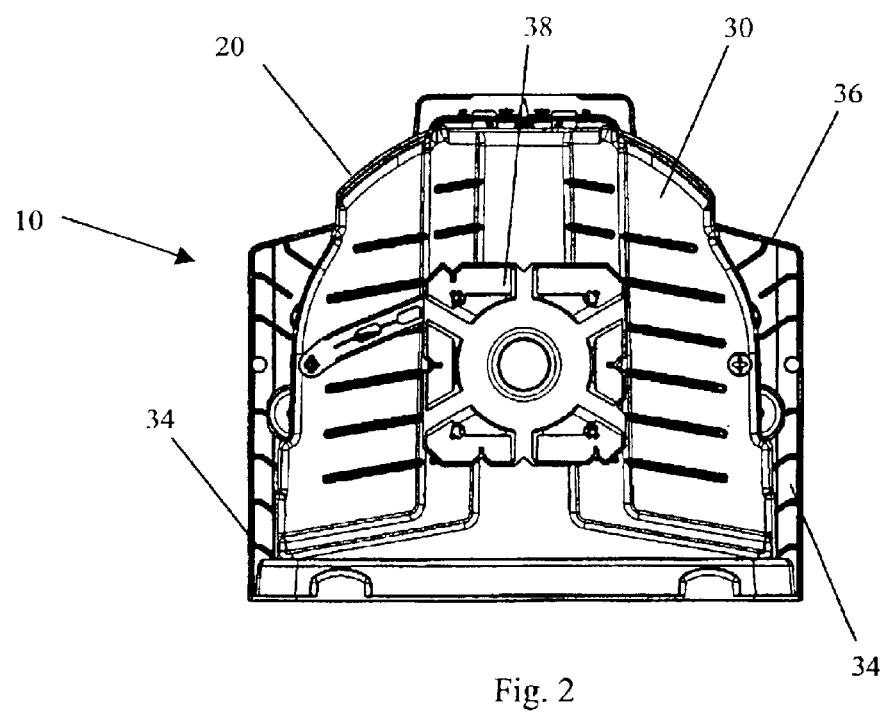
FIG. 2 is a top view of the wafer carrier.
Figure 3:
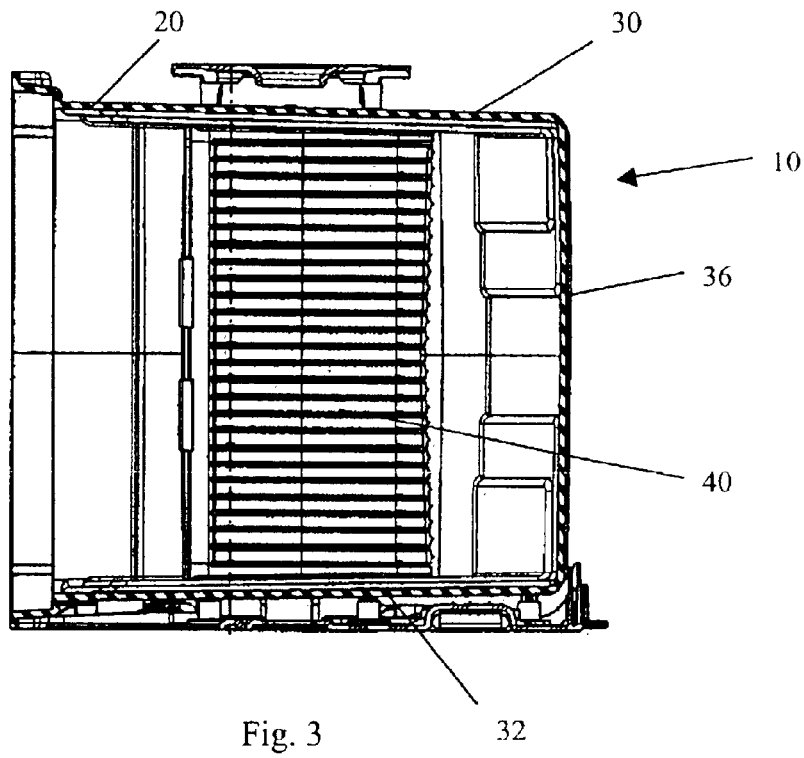
FIG. 3 is a side view of the wafer carrier.
Figure 4:
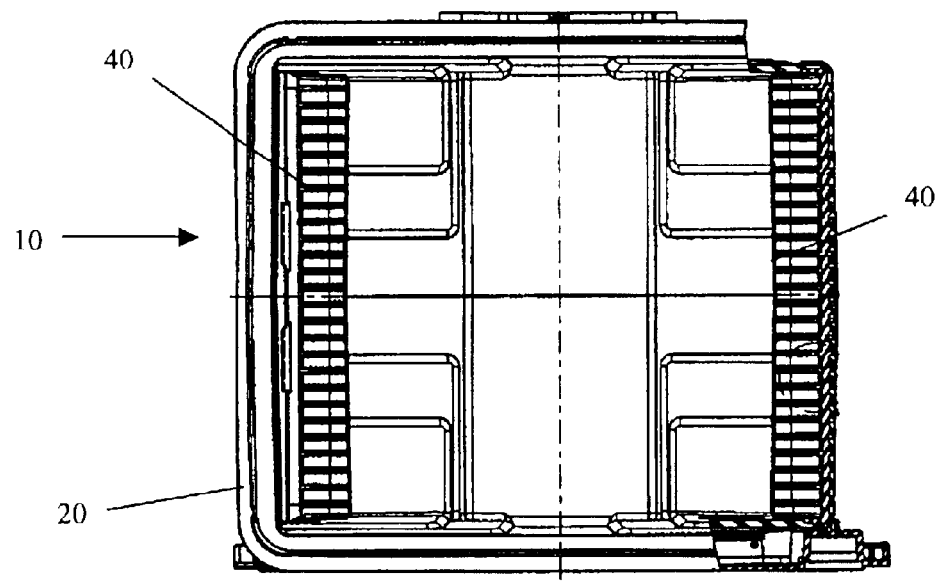
FIG. 4 is a sectional view of the wafer carrier taken along a line B—B in FIG. 3.
Figure 5:
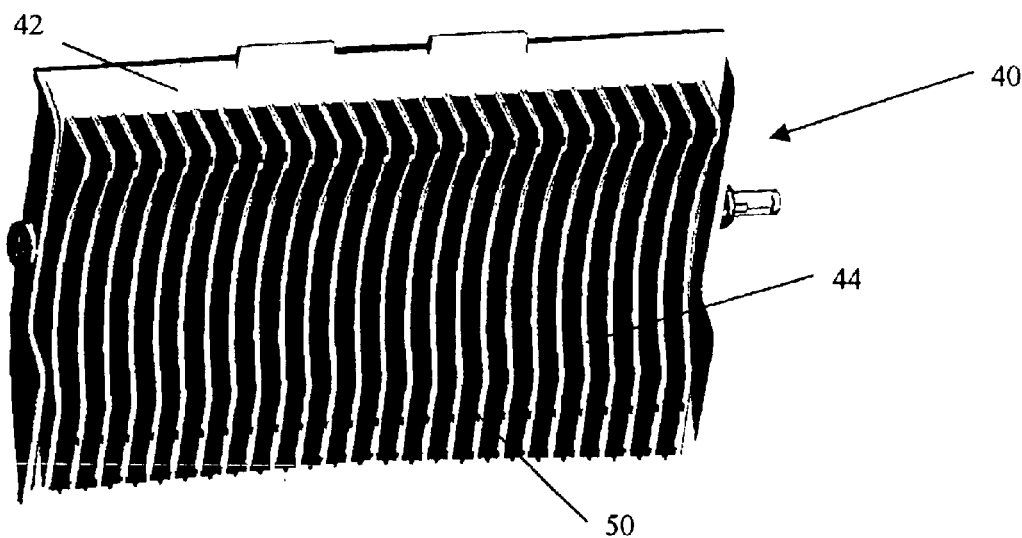
FIG. 5 is a perspective view of a wafer support structure of the wafer carrier.
Figure 6:
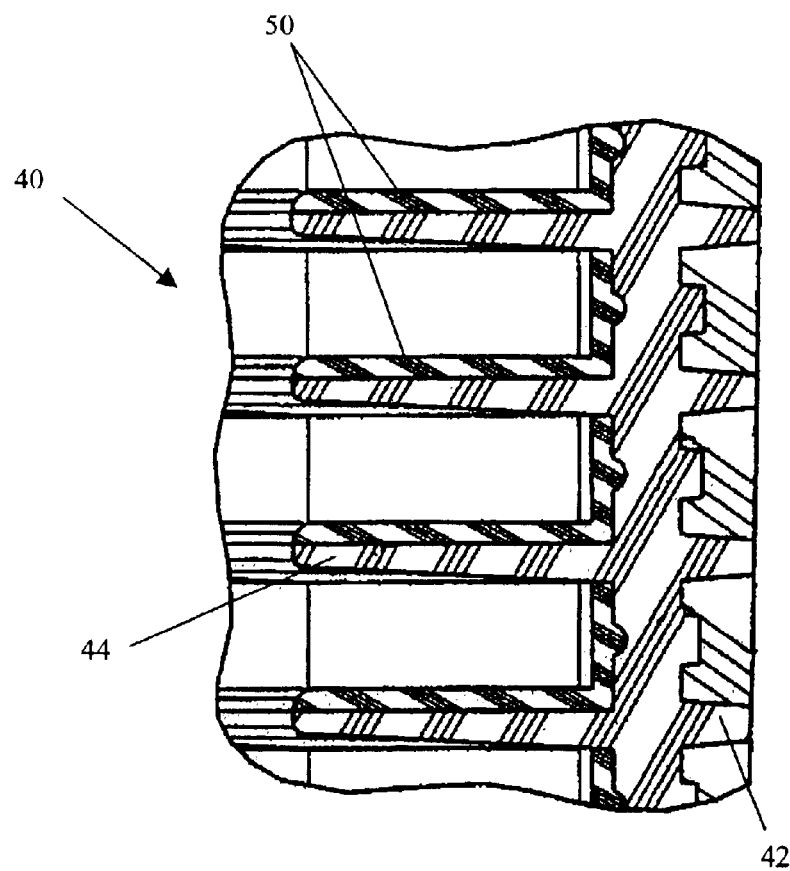
FIG. 6 is an enlarged view illustrating attachment of wafer contact portions to wafer support shelves on the wafer support structure.

An embodiment of the present invention is directed to a composite wafer carrier, as most clearly illustrated at 10 in FIG. 1. The composite wafer carrier 10 generally includes an enclosure portion 20 that is adapted to receive a plurality of silicon wafers (not shown) to protect the wafers at different stages during the manufacture of a semiconductor chip.

The wafer carrier 10 is fabricated in at least three molding steps to form an integral structure. By fabricating the wafer carrier 10 in the at least three molding steps, it is possible to use materials that are particularly suited for aspects of the wafer carrier. Molding in at least three steps also provides enhanced accuracy in the molding process. Molding in the at least three steps obviates problems associated with prior wafer carriers where the components having different characteristics are mechanically or chemically fastened together after the components are molded.

The enclosure portion 20 is defined by a top wall 30, a bottom wall 32, a pair of side walls 34, and a back wall 36. One or more of the walls may include mechanisms to facilitate handling of the wafer carrier 10 using conventional equipment. One such mechanism is a plate 38 attached to the top wall 30.

The enclosure portion 20 is preferably molded of a relatively inexpensive material that exhibits a high dimensional stability and that is easily molded. Examples of materials having these characteristics are polycarbonate or polycarbonate with carbon fiber filler.

The enclosure portion 20 is adapted to receive a door portion (not shown) that substantially seals the enclosure portion 20 to retain the wafers at a fixed position within the wafer carrier 10. The door portion also prevents contaminants from entering the wafer carrier 10.

The enclosure portion 20 has a wafer support structure 40 molded to the side walls 34. Depending on the configuration of the wafer carrier 10, it is also possible to mold the wafer support structure 40 on the back wall 36 and the door portion.

The wafer support structure 40 preferably includes a base 42 and a plurality of shelves 44 extending therefrom. The shelves 44 are preferably oriented in a substantially equally spaced configuration. The number of shelves 44 and the spacing between the shelves 44 is selected based upon a variety of factors including the thickness of the wafers and the number of wafers that are desired to be stored in the wafer carrier 10.

The wafer support structure 40 is preferably molded of a relatively inexpensive material that exhibits a high dimensional stability and that is easily molded. Examples of materials having these characteristics are polycarbonate or polycarbonate with carbon fiber filler. Molding the wafer support structure 40 separate from the enclosure portion 20 allows for enhanced accuracy in forming the base 42 and the shelves 44 when compared to molding these components in a single step process.

Wafer contact surfaces 50 on the shelves 44 and the base 42 are covered with a material that minimizes the potential for damage to the wafers. The wafer contact surfaces 50 are preferably molded on the shelves 44 and the base 42 before the enclosure portion 20 is molded over the wafer support structure 40.

Wafer contact surfaces 50 are fabricated from a melt processable, crystalline plastic such as PEEK or PEEK with carbon fiber filler. With respect to their morphological structure and their processing temperatures, these materials are preferably dissimilar from the materials used to form the enclosure portion 20 and the wafer support structure 40.

Other combinations of morphologically dissimilar materials could also be used with advantages that are similar to the advantages provided by the materials discussed above. The amorphous material, polycarbonate, and the crystalline material, PEEK, form a thermophysical bond when the amorphous material comes in contact with the crystalline material in a molten state. It is believed that the bond is formed by the virtue of the increase in surface energy of the polymer class at the interface between the materials.

When the hot amorphous melt comes in contact with the polymer glass, the polycarbonate, it elevates the surface energy of the polymer glass and as the hot melt is cooling down, it crystallizes at the interface between the materials. It is theorized that the crystallization process attributes to the bond of the two materials.

The heat dissipates into the polymer glass at a very slow rate because of its low specific heat and thus the hot melt of PEEK cools at a lower rate increasing the crystallinity at the interface of the materials. When this process is carried out in an injection mold, the product formed will have a higher crystallinity level at the interface of the polymer glass and crystal than at the interface of the polymer glass and the mold steel because of the difference in specific heat of steel and polymer glass.

In a preferred embodiment, the polycarbonate would be molded first and then placed back into an injection mold to mold PEEK over it. In this process, the mold temperature is ideally kept below the glass transition temperature of polycarbonate, which is approximately 149° C., to prevent distortion of the polycarbonate base portion.

An alternative amorphous material in which a favorable bond has been observed is polyetherimide (PEI). It is theorized that this bond may have a chemical bonding component.

Several components may be formed in the overmold process to take advantage of the inherent features and advantages of the process of the present invention. For example, a polycarbonate window (not shown) may be molded of a desired configuration and size and inserted into the mold for the cover portion (not shown) with the balance of the cover portion overmolded to the polycarbonate window. The overmolding provides juncture of high integrity without the use of adhesives or mechanical fasteners.

In addition to overmolding the wafer contact surfaces from PEEK, it is also contemplated in the scope of the present invention to overmold a machine interface from PEEK or other similar materials to enhance the useful life of the wafer carrier.

A first mold is provided for molding the wafer support structure. The wafer support structure 40 is molded and then put into an additional mold or, alternately, the same mold with a mold insert removed.

Next, the mold is closed and overmolding material such as PEEK is injected into the mold cavity that corresponds to the wafer contact surfaces that are being overmolded. The wafer support structure 40 with the overmolded wafer contact surfaces 50 is placed in another mold or in the same mold with a mold insert removed. The enclosure portion 20 is then molded over the wafer support structure 40 from polycarbonate or other suitable material to form the wafer carrier 10.

In particular applications, it may be suitable to have the first injection molded portion to be relatively smaller volumetrically than the second overmolded portion. In other applications, a first material may be deposited at critical positions in a mold, for example the wafer contact areas, the material is allowed to solidify and a second support portion is overmolded onto the first material without changing molds.

In other particular applications, the second material does not have to be allowed to solidify so that two materials may join while both materials are molten. This coinjection molding may not offer the precision in locating the interface between the first portion and the second portion. However, it does eliminate the need for the extra mold and the steps of allowing the first portion to solidify, removing the portion from the mold, and placement of the first portion in a second mold.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

What is claimed is:

1. A process for manufacturing a wafer carrier comprising the steps of:

injection molding a wafer support structure, wherein the wafer support structure has a plurality of wafer support shelves extending therefrom;

molding a wafer contact portion on each of the wafer support shelves, wherein the wafer contact portions bond with the wafer support shelves without mechanical fasteners between the wafer contact portions and the wafer support shelves; and overmolding a shell over the wafer support structure to form the wafer carrier, wherein the shell bonds with the wafer support structure without mechanical fasteners between the shell and the wafer support structure, and wherein the wafer contact portions define a plurality of slots for holding a plurality of wafers.

2. The process of claim 1, wherein the wafer support structure is molded from a first plastic material, wherein the wafer contact portions are molded from a second plastic material, and wherein the second plastic material is different from the first plastic material.

3. The process of claim 2, wherein the second material has at least one of the following characteristics: reducing static discharge and resisting abrasion.

4. The process of claim 2, wherein the shell is molded from a third material that is different from at least one of the first material and the second material.

5. The process of claim 1, wherein the wafer contact portions each include a first contact section and a second contact section, wherein the first contact section is capable of engaging a lower surface on the wafer, and wherein the second contact section is capable of engaging a side surface on the wafer.

6. A process for manufacturing a wafer carrier comprising the steps of:

melting a first plastic that comprises a polycarbonate resin, wherein the polycarbonate material has a glass transition temperature;

injection molding a wafer support structure from the first plastic in a first mold portion, wherein the wafer support structure has a plurality of wafer support shelves;

placing the molded wafer support structure in a second mold portion;

molding a wafer contact portion on each of the wafer support shelves in the second mold to produce an intermediate wafer support structure, wherein the wafer contact portions bond with the wafer support shelves without mechanical fasteners between the wafer contact portions and the wafer support shelves;

placing the intermediate wafer support structure in a third mold; and molding a shell over the intermediate wafer support structure to form the wafer carrier, wherein the shell bonds with the intermediate wafer support structure without mechanical fasteners between the shell and the intermediate wafer support structure, and wherein the wafer contact portions define a plurality of slots for holding a plurality of wafers.

7. The process of claim 6, wherein the wafer support structure is molded from a first plastic material, wherein the wafer contact portions are molded from a second plastic material, and wherein the second plastic material is different from the first plastic material.

8. The process of claim 7, wherein the second material has at least one of the following characteristics: reducing static discharge and resisting abrasion.

9. The process of claim 7, wherein the shell is molded from a third material that is different from at least one of the first material and the second material.

10. The process of claim 7, and further comprising the step of melting a resin comprised of one of the set of polyetheretherketone and polyetherimide as the second plastic material.

11. The process of claim 10, and further comprising the step of adding carbon fiber to the one of the set of polyetheretherketone and polyetherimide.

12. The process of claim 6, wherein a temperature of the second mold is maintained below the glass transition temperature of the wafer support structure when molding the wafer contact portions.

13. The process of claim 6, wherein the wafer contact portions each include a first contact section and a second contact section, wherein the first contact section is capable of engaging a lower surface on the wafer, and wherein the second contact section is capable of engaging a side surface on the wafer.

* * * * *